United States Patent
Zhou et al.

(10) Patent No.: US 9,172,375 B1
(45) Date of Patent: Oct. 27, 2015

(54) LEVEL SHIFTER AND DIGITAL TO ANALOG CONVERTER

(71) Applicant: Huawei Technologies Co., Ltd., Shenzhen (CN)

(72) Inventors: Liren Zhou, Shanghai (CN); Jun Xiong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/672,919

(22) Filed: Mar. 30, 2015

(30) Foreign Application Priority Data

Apr. 16, 2014 (CN) .......................... 2014 1 0152918

(51) Int. Cl.
*H03M 1/00* (2006.01)
*H03K 19/0185* (2006.01)
*H03M 1/66* (2006.01)

(52) U.S. Cl.
CPC ............. *H03K 19/0185* (2013.01); *H03M 1/66* (2013.01)

(58) Field of Classification Search
CPC ....... H03M 1/747; H03M 1/66; H03M 1/765; H03M 1/745; H03M 1/0607; H03M 1/742; H03M 1/687; H03K 19/018521; H03K 19/0013; H03K 3/356113; H03K 3/356165; H03K 17/08142; H03K 17/102; H03K 17/161; H03K 17/687; H03K 19/0027; H03K 17/063; H03K 17/0822; H03K 2005/00071
USPC .......... 341/136, 144; 327/333, 309, 198, 199, 327/427; 326/68, 63, 80, 86, 87, 81
See application file for complete search history.

(56) References Cited

U.S. PATENT DOCUMENTS

| | | | | |
|---|---|---|---|---|
| 5,625,360 A * | 4/1997 | Garrity | ............... | H03M 1/0863 341/144 |
| 6,563,447 B1 * | 5/2003 | Schofield | ......... | H03K 17/04106 341/136 |
| 6,741,115 B2 * | 5/2004 | Lundberg | ............. | H03K 17/102 326/68 |
| 7,180,355 B2 * | 2/2007 | Teraishi | ................. | G09G 3/006 326/68 |
| 8,618,971 B1 * | 12/2013 | Li | ........................... | H03M 1/68 341/144 |
| 8,643,521 B1 * | 2/2014 | Cheng | ................. | H03M 1/0818 341/136 |
| 8,928,513 B1 * | 1/2015 | Waltari | ................... | H03M 1/66 341/136 |
| 2007/0035339 A1 * | 2/2007 | Park | ................. | H03K 3/356165 327/333 |
| 2009/0027100 A1 * | 1/2009 | Choi | .................... | G09G 3/3266 327/333 |
| 2009/0206878 A1 * | 8/2009 | Fan | .................. | H03K 3/356139 326/80 |
| 2009/0303094 A1 * | 12/2009 | Pun | ..................... | H03F 3/45071 341/144 |
| 2012/0146988 A1 * | 6/2012 | Tsuchi | ............. | H03K 3/356165 345/212 |
| 2013/0162294 A1 * | 6/2013 | Henmi | ........... | H03K 19/018507 326/80 |

* cited by examiner

*Primary Examiner* — Linh Nguyen

(74) *Attorney, Agent, or Firm* — Conley Rose, P.C.; Grant Rodolph; Nicholas K. Beaulieu

(57) ABSTRACT

Provided are a level shifter and a digital to analog converter, which can make a minimum value of an output voltage be greater than 0. In the circuit, sources of a first field effect transistor and a second field effect transistor are connected to a first direct current power supply; a drain of the first field effect transistor and a gate of the second field effect transistor are connected to one terminal of a first capacitor; a connecting end formed after the other terminal of the first capacitor is connected to an input end of a phase inverter is used as a digital signal input end; a gate of the first field effect transistor, a drain of the second field effect transistor, a source of a third field effect transistor, and a source of a fifth field effect transistor are connected to one terminal of a second capacitor.

7 Claims, 7 Drawing Sheets

US 9,172,375 B1

LEVEL SHIFTER AND DIGITAL TO ANALOG CONVERTER

CROSS-REFERENCE TO RELATED APPLICATION

This application claims priority to Chinese Patent Application No. 201410152918.8, filed on Apr. 16, 2014, the contents of which are hereby incorporated herein by reference.

TECHNICAL FIELD

The present invention relates to the field of electronic technologies, and in particular, to a level shifter and a digital to analog converter.

BACKGROUND

At present, digital to analog converters have been widely applied in various fields. For example, in a communications base station, both a receive channel and a feedback channel generally need a high-speed and high-precision digital to analog converter.

A level shifter used in a digital to analog converter in the prior art is shown in FIG. 1, and includes a first field effect transistor M1, a second field effect transistor M2, a third field effect transistor M3, a fourth field effect transistor M4, a first capacitor C1, a second capacitor C2, and a phase inverter IVN, where the first field effect transistor M1, the second field effect transistor M2, and the fourth field effect transistor M4 are N-type field effect transistors, and the third field effect transistor M3 is a P-type field effect transistor; a source of the first field effect transistor M1 is connected to a source of the second field effect transistor M2, and a connecting end after the connection is connected to a direct current power supply, where the direct current power supply is a working power supply of the level shifter; a drain of the first field effect transistor M1 and a gate of the second field effect transistor M2 are connected to one terminal of the first capacitor C1; and the other terminal of the first capacitor C1 is connected to an input end of the phase inverter IVN, and a connecting end after the connection is used as a digital signal input end Vin; a gate of the first field effect transistor M1, a drain of the second field effect transistor M2, and a source of the third field effect transistor M3 are connected to one terminal of the second capacitor C2; and the other terminal of the second capacitor C2 and a source of the fourth field effect transistor M4 are connected to an output end of the phase inverter IVN; a power supply end of the phase inverter IVN is connected to the direct current power supply; a drain of the third field effect transistor M3 is connected to a drain of the fourth field effect transistor M4, and a connecting end after the connection is used as an analog signal output end Vout; and a gate of the third field effect transistor M3 and a gate of the fourth field effect transistor M4 may be connected to the direct current power supply.

In the level shifter shown in FIG. 1, because at the digital signal input end Vin, sometimes a digital signal "0" is input and sometimes a digital signal "1" is input, the first field effect transistor M1 sometimes is turned off and sometimes is turned on, to charge the first capacitor C1. Likewise, the second field effect transistor M2 sometimes is turned off and sometimes is turned on, to charge the second capacitor C2, so that a voltage difference exists between the two terminals of the first capacitor C1 and between the two terminals of the second capacitor C2, where the voltage difference is a direct current power supply voltage Vdd.

When a digital signal "0" is input at the digital signal input end Vin, a voltage corresponding to the digital signal "0" is 0. Potentials at points in the level shifter shown in FIG. 1 are shown in FIG. 2. A voltage of the input end of the phase inverter IVN is 0, and a voltage of the output end of the phase inverter IVN is Vdd. Because the voltage difference between the two terminals of the first capacitor C1 and the voltage difference between the two terminals of the second capacitor C2 cannot change suddenly, a voltage at the drain of the first field effect transistor M1, that is, a voltage at the gate of the second field effect transistor M2, is Vdd, and a voltage at the drain of the second field effect transistor M2 and at the source of the third field effect transistor M3, that is, a voltage at the gate of the first field effect transistor M1, is 2Vdd. According to the potentials at the points and types of the field effect transistors, states of the field effect transistors may be determined. Because the first field effect transistor M1 is an N-type field effect transistor, and the gate voltage 2Vdd is higher than the source voltage Vdd, the first field effect transistor M1 is turned on, and the first capacitor C1 is charged; because the second field effect transistor M2 is an N-type field effect transistor, and the gate voltage Vdd is not higher than the source voltage Vdd, the second field effect transistor M2 is turned off; because the third field effect transistor M3 is a P-type field effect transistor, and the gate voltage Vdd is lower than the source voltage 2Vdd, the third field effect transistor M3 is turned on; and because the fourth field effect transistor M4 is an N-type field effect transistor, and the gate voltage Vdd is not higher than the source voltage Vdd, the fourth field effect transistor M4 is turned off. That is, when a digital signal "0" is input at the digital signal input end Vin, an output voltage of the analog signal output end Vout is 2Vdd.

When a digital signal "1" is input at the digital signal input end Vin, it is assumed that a voltage corresponding to the digital signal "1" is V0, and V0>0. Potentials at the points in the level shifter shown in FIG. 1 are shown in FIG. 3. A voltage of the input end of the phase inverter IVN is V0, and a voltage of the output end of the phase inverter IVN is 0. Because the voltage difference between the two terminals of the first capacitor C1 and the voltage difference between the two terminals of the second capacitor C2 cannot change suddenly, a voltage at the drain of the first field effect transistor M1, that is, the gate of the second field effect transistor M2, is Vdd+V0, and a voltage at the drain of the second field effect transistor M2 and at the source of the third field effect transistor M3, that is, the gate of the first field effect transistor M1, is Vdd. According to the potentials at the points and types of the field effect transistors, states of the field effect transistors may be determined. Because the first field effect transistor M1 is an N-type field effect transistor, and the gate voltage Vdd is not higher than the source voltage Vdd, the first field effect transistor M1 is turned off; because the second field effect transistor M2 is an N-type field effect transistor, and the gate voltage Vdd+V0 is higher than the source voltage Vdd, the second field effect transistor M2 is turned on, and the second capacitor C2 is charged; because the third field effect transistor M3 is a P-type field effect transistor, and the gate voltage Vdd is not lower than the source voltage Vdd, the third field effect transistor M3 is turned off; and because the fourth field effect transistor M4 is an N-type field effect transistor, and the gate voltage Vdd is higher than a source voltage 0, the fourth field effect transistor M4 is turned on. That is, when a digital signal "1" is input at the digital signal input end Vin, an output voltage of the analog signal output end Vout is 0.

It can be seen that, a minimum value of an output voltage of the level shifter in the prior art is 0. For some application scenarios in which there is a requirement that a minimum value of an output voltage of a level shifter is greater than 0, the level shifter shown in FIG. 1 obviously cannot meet the requirement, and therefore application scenarios of the level shifter are limited.

SUMMARY

Embodiments of the present invention provide a level shifter and a digital to analog converter, which are used to make a minimum value of an output voltage be greater than 0.

According to a first aspect, a level shifter is provided, including a first field effect transistor, a second field effect transistor, a third field effect transistor, a fourth field effect transistor, a fifth field effect transistor, a sixth field effect transistor, a first capacitor, a second capacitor, and a phase inverter, where the first field effect transistor, the second field effect transistor, and the fourth field effect transistor are N-type field effect transistors; and the third field effect transistor, the fifth field effect transistor, and the sixth field effect transistor are P-type field effect transistors; a source of the first field effect transistor is connected to a source of the second field effect transistor, and a connecting end after the connection is connected to a first direct current power supply; a drain of the first field effect transistor and a gate of the second field effect transistor are connected to one terminal of the first capacitor; and the other terminal of the first capacitor is connected to an input end of the phase inverter, and a connecting end after the connection is used as a digital signal input end.

A gate of the first field effect transistor, a drain of the second field effect transistor, a source of the third field effect transistor, and a source of the fifth field effect transistor are connected to one terminal of the second capacitor; and the other terminal of the second capacitor and a source of the fourth field effect transistor are connected to an output end of the phase inverter; a power supply end of the phase inverter is connected to a second direct current power supply, where the second direct current power supply is a working power supply of the level shifter, and a sum of a voltage of the first direct current power supply and a voltage of the second direct current power supply is a maximum value of a target output voltage of the level shifter; a source of the sixth field effect transistor is connected to a third direct current power supply, where a voltage of the third direct current power supply is a minimum value of the target output voltage of the level shifter; a drain of the third field effect transistor and a drain of the fourth field effect transistor are connected to a gate of the sixth field effect transistor; and a drain of the fifth field effect transistor is connected to a drain of the sixth field effect transistor, and a connecting end after the connection is used as a first analog signal output end; and when a digital signal "0" is input at the digital signal input end, the third field effect transistor and the fifth field effect transistor are turned on, and the fourth field effect transistor is turned off; and when a digital signal "1" is input at the digital signal input end, the third field effect transistor and the fifth field effect transistor are turned off, and the fourth field effect transistor is turned on.

With reference to the first aspect, in a first possible implementation manner, a connecting end formed after the drain of the third field effect transistor and the drain of the fourth field effect transistor are connected to the gate of the sixth field effect transistor is used as a second analog signal output end.

With reference to the first aspect or the first possible implementation manner of the first aspect, in a second possible implementation manner, a gate of the third field effect transistor and a gate of the fifth field effect transistor are connected to the first direct current power supply; and a gate of the fourth field effect transistor is connected to the second direct current power supply.

With reference to the first aspect, the first possible implementation manner of the first aspect, or the second possible implementation manner of the first aspect, in a third possible implementation manner, further includes a seventh field effect transistor, an eighth field effect transistor, a ninth field effect transistor, and a tenth field effect transistor, where the seventh field effect transistor and the ninth field effect transistor are P-type field effect transistors; and the eighth field effect transistor and the tenth field effect transistor are N-type field effect transistors; the drain of the third field effect transistor is connected to a source of the seventh field effect transistor; the drain of the fourth field effect transistor is connected to a source of the eighth field effect transistor; and a drain of the seventh field effect transistor and a drain of the eighth field effect transistor are connected to the gate of the sixth field effect transistor; the drain of the fifth field effect transistor is connected to a source of the ninth field effect transistor; the drain of the sixth field effect transistor is connected to a source of the tenth field effect transistor; and a drain of the ninth field effect transistor is connected to a drain of the tenth field effect transistor, and a connecting end after the connection is used as the first analog signal output end; and when a digital signal "0" is input at the digital signal input end, the seventh field effect transistor and the ninth field effect transistor are turned on, and the eighth field effect transistor and the tenth field effect transistor are turned off; and when a digital signal "1" is input at the digital signal input end, the seventh field effect transistor and the ninth field effect transistor are turned off, and the eighth field effect transistor and the tenth field effect transistor are turned on.

With reference to the third possible implementation manner of the first aspect, in a fourth possible implementation manner, a connecting end after the drain of the seventh field effect transistor and the drain of the eighth field effect transistor are connected to the gate of the sixth field effect transistor is used as the second analog signal output end.

With reference to the third possible implementation manner of the first aspect, or the fourth possible implementation manner of the first aspect, in a fifth possible implementation manner, a gate of the seventh field effect transistor and a gate of the ninth field effect transistor are connected to the second direct current power supply; and a gate of the eighth field effect transistor and a gate of the tenth field effect transistor are connected to the first direct current power supply.

According to a second aspect, a digital to analog converter is provided, including the foregoing level shifter.

According to the level shifter provided in the first aspect and the digital to analog converter provided in the second aspect, two field effect transistors, that is, a fifth field effect transistor and a sixth field effect transistor are added to an existing level shifter. When a digital signal input end inputs a digital signal "0", a first field effect transistor, a third field effect transistor, and the fifth field effect transistor are turned on, a second field effect transistor, a fourth field effect transistor, and the sixth field effect transistor are turned off, and an output voltage of a first analog signal output end is a sum of a voltage of a first direct current power supply and a voltage of a second direct current power supply. When a digital signal "1" is input at the digital signal input end, the first field effect transistor, the third field effect transistor, and the fifth field effect transistor are turned off, the second field effect transistor, the fourth field effect transistor, and the sixth field effect transistor are turned on, and the output voltage of the first analog signal output end is a voltage of a third direct current power supply. It can be seen that, by setting a voltage of the third direct current power supply connected to a source of the sixth field effect transistor, a minimum value of an output voltage can be used as a target value, that is, a minimum value of an output voltage is greater than 0.

BRIEF DESCRIPTION OF DRAWINGS

The accompanying drawings are used to further understand the present invention, constitute a part of this specification, and are used to explain the present invention together with embodiments of the present invention, but do not constitute a limitation to the present invention. In the accompanying drawings.

DESCRIPTION OF EMBODIMENTS

To provide an implementation solution in which a minimum value of an output voltage is greater than 0, embodiments of the present invention provide a level shifter and a digital to analog converter, and exemplary embodiments of the present invention are described below with reference to the accompanying drawings of this specification. It should be understood that, the exemplary embodiments described herein are merely used to describe and explain the present invention, but are not intended to limit the present invention. In addition, in a case in which there is no conflict, the embodiments in this application and characteristics of the embodiments can be combined with each other.

Embodiment 1

Figure 1:
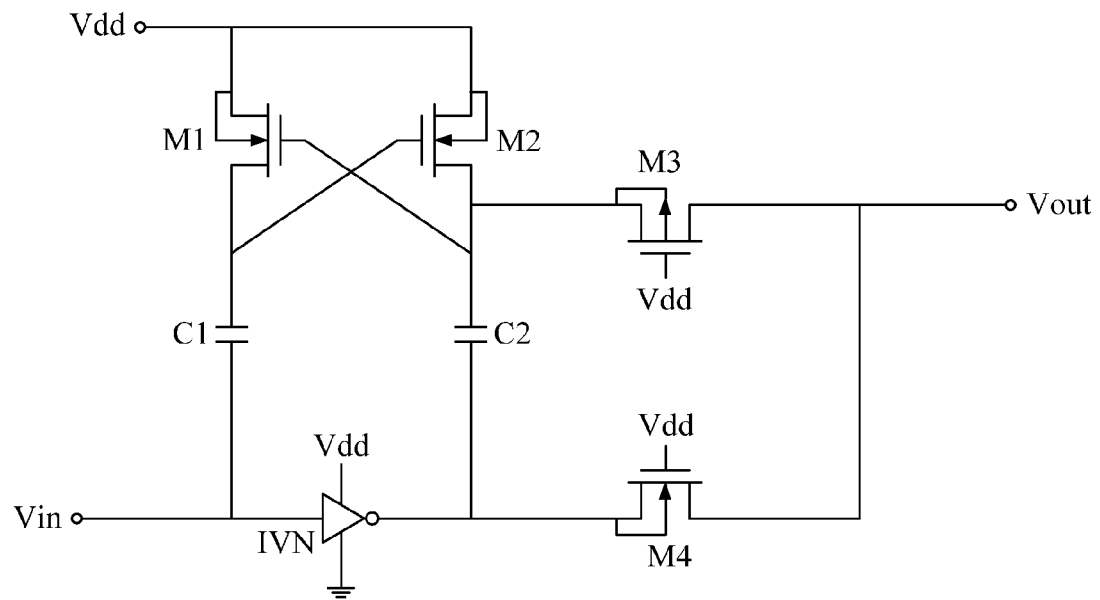
FIG. 1 is a schematic diagram of a level shifter in the prior art.
Figure 2:
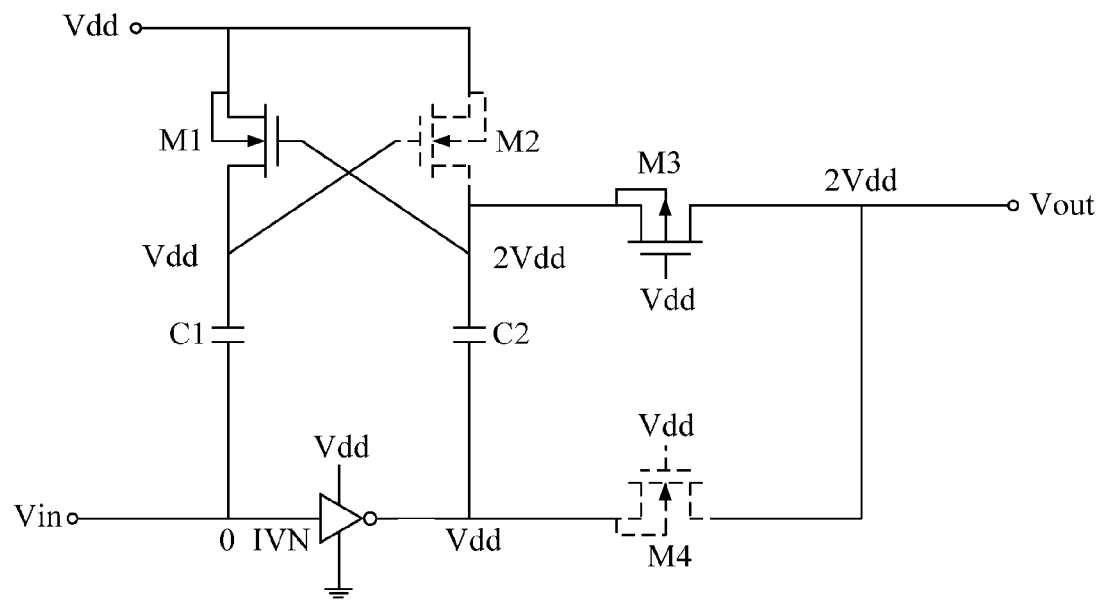
FIG. 2 is a schematic diagram showing potentials at points when a digital signal "0" is input in a level shifter in the prior art.
Figure 3:
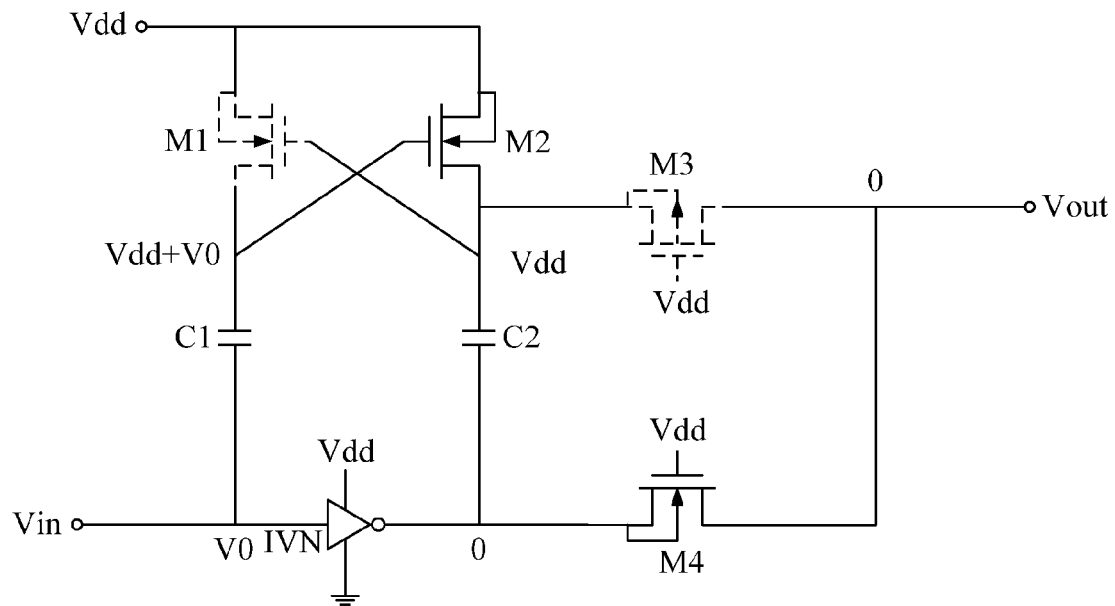
FIG. 3 is a schematic diagram showing potentials at points when a digital signal "1" is input in a level shifter in the prior art.
Figure 4:
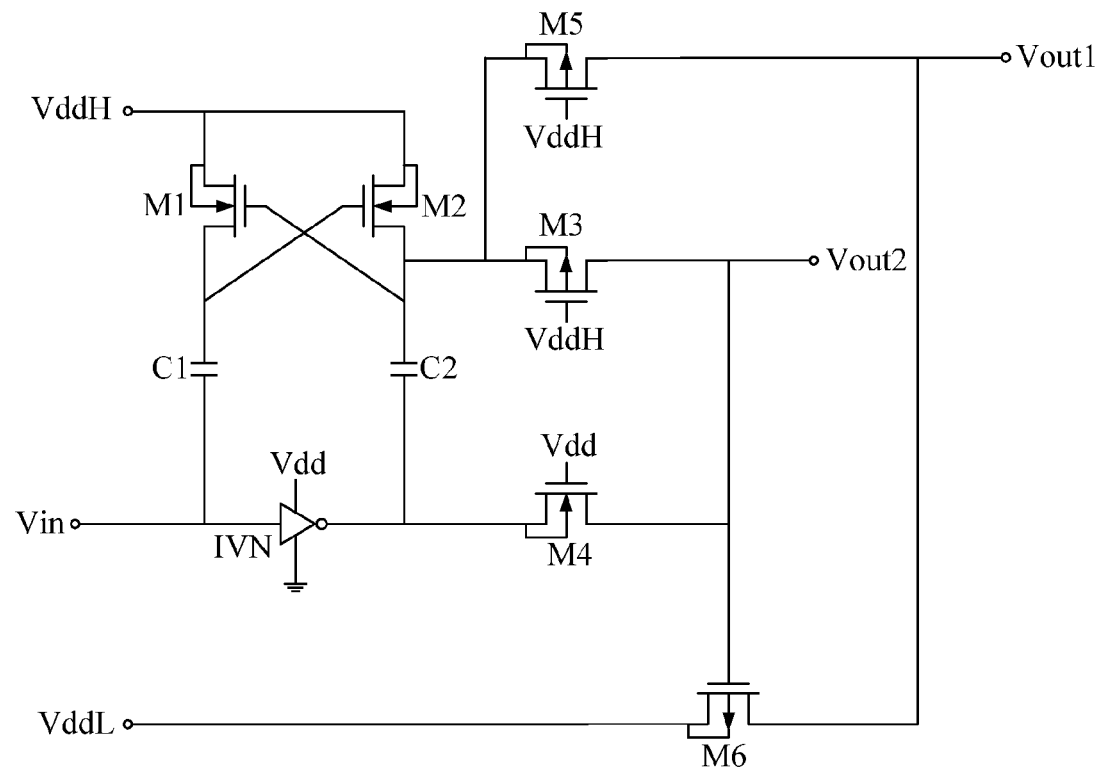
FIG. 4 is a schematic diagram of a level shifter according to Embodiment 1 of the present invention.

Embodiment 1 of the present invention provides a level shifter, which, as shown in FIG. 4, includes a first field effect transistor M1, a second field effect transistor M2, a third field effect transistor M3, a fourth field effect transistor M4, a fifth field effect transistor M5, a sixth field effect transistor M6, a first capacitor C1, a second capacitor C2, and a phase inverter IVN, where the first field effect transistor M1, the second field effect transistor M2, and the fourth field effect transistor M4 are N-type field effect transistors; and the third field effect transistor M3, the fifth field effect transistor M5, and the sixth field effect transistor M6 are P-type field effect transistors; a source of the first field effect transistor M1 is connected to a source of the second field effect transistor M2, and a connecting end after the connection is connected to a first direct current power supply; a drain of the first field effect transistor M1 and a gate of the second field effect transistor M2 are connected to one terminal of the first capacitor C1; and the other terminal of the first capacitor C1 is connected to an input end of the phase inverter IVN, and a connecting end after the connection is used as a digital signal input end Vin; a gate of the first field effect transistor M1, a drain of the second field effect transistor M2, a source of the third field effect transistor M3, and a source of the fifth field effect transistor M5 are connected to one terminal of the second capacitor C2; and the other terminal of the second capacitor C2 and a source of the fourth field effect transistor M4 are connected to an output end of the phase inverter IVN; a power supply end of the phase inverter IVN is connected to a second direct current power supply, where the second direct current power supply is a working power supply of the level shifter, and a sum of a voltage VddH of the first direct current power supply and a voltage Vdd of the second direct current power supply is a maximum value of a target output voltage of the level shifter; a source of the sixth field effect transistor M6 is connected to a third direct current power supply, where a voltage VddL of the third direct current power supply is a minimum value of the target output voltage of the level shifter; a drain of the third field effect transistor M3 and a drain of the fourth field effect transistor M4 are connected to a gate of the sixth field effect transistor M6; and a drain of the fifth field effect transistor M5 is connected to a drain of the sixth field effect transistor M6, and a connecting end after the connection is used as a first analog signal output end Vout1; and when a digital signal "0" is input at the digital signal input end, the third field effect transistor M3 and the fifth field effect transistor M5 are turned on, and the fourth field effect transistor M4 is turned off; and when a digital signal "1" is input at the digital signal input end, the third field effect transistor M3 and the fifth field effect transistor M5 are turned off, and the fourth field effect transistor M4 is turned on.

Further, a connecting end formed after the drain of the third field effect transistor M3 and the drain of the fourth field effect transistor M4 are connected to the gate of the sixth field effect transistor M6 may be used as a second analog signal output end Vout2.

In Embodiment 1 of the present invention, a gate of the third field effect transistor M3 and a gate of the fifth field effect transistor M5 may be connected to the first direct current power supply, and a gate of the fourth field effect transistor M4 may be connected to the second direct current power supply. In this way, when a digital signal "0" is input at the digital signal input end, it can be implemented that the third field effect transistor M3 and the fifth field effect transistor M5 are turned on, and the fourth field effect transistor M4 is turned off; and when a digital signal "1" is input at the digital signal input end, the third field effect transistor M3 and the fifth field effect transistor M5 are turned off, and the fourth field effect transistor M4 is turned on.

The connecting manners of the gates of the third field effect transistor M3, the fourth field effect transistor M4, and the fifth field effect transistor M5 are merely used as examples, but are not intended to limit the present invention. As long as when a digital signal "0" is input at the digital signal input end, the third field effect transistor M3 and the fifth field effect transistor M5 are turned on, and the fourth field effect transistor M4 is turned off, and when a digital signal "1" is input at the digital signal input end, the third field effect transistor M3 and the fifth field effect transistor M5 are turned off, and the fourth field effect transistor M4 is turned on, any gate connecting manner, or any control manner of field effect transistors is acceptable.

To further describe the level shifter provided in Embodiment 1 of the present invention, a working principle of the level shifter is described below in detail with reference to the accompanying drawings In the level shifter shown in FIG. 4, because at the digital signal input end Vin, sometimes a digital signal "0" is input and sometimes a digital signal "1" is input, the first field effect transistor M1 sometimes is turned off and sometimes is turned on, to charge the first capacitor C1. Likewise, the second field effect transistor M2 sometimes is turned off and sometimes is turned on, to charge the second capacitor C2, so that a voltage difference exists between the two terminals of the first capacitor C1 and between the two terminals of the second capacitor C2, where the voltage difference is a direct current power supply voltage VddH.

Figure 5:
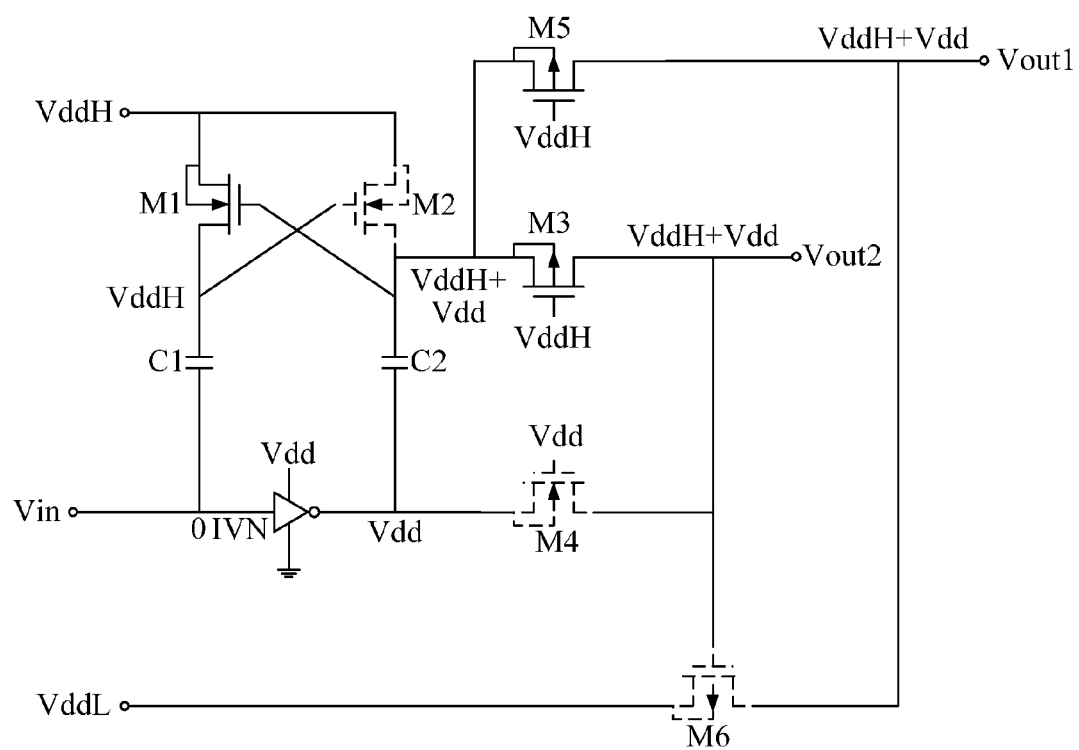
FIG. 5 is a schematic diagram showing potentials at points when a digital signal "0" is input in a level shifter according to Embodiment 1 of the present invention.

When a digital signal "0" is input at the digital signal input end Vin, a voltage corresponding to the digital signal "0" is 0. Potentials at points in the level shifter shown in FIG. 4 are shown in FIG. 5. A voltage of the input end of the phase inverter IVN is 0, and a voltage of the output end of the phase inverter IVN is Vdd. Because the voltage difference between the two terminals of the first capacitor C1 and the voltage difference between the two terminals of the second capacitor C2 cannot change suddenly, a voltage at the drain of the first field effect transistor M1, that is, the gate of the second field effect transistor M2, is VddH, and a voltage at the drain of the second field effect transistor M2, at the source of the third field effect transistor M3, and at the source of the fifth field effect transistor M5, that is, the gate of the first field effect transistor M1, is VddH+Vdd. According to the potentials at the points and types of the field effect transistors, states of the field effect transistors may be determined.

Because the first field effect transistor is an N-type field effect transistor, and the gate voltage VddH+Vdd is higher than the source voltage VddH, the first field effect transistor M1 is turned on and the first capacitor is charged; and because the second field effect transistor is an N-type field effect transistor, and the gate voltage VddH is not higher than the source voltage VddH, the second field effect transistor M2 is turned off Because the third field effect transistor M3 is a P-type field effect transistor, and the gate voltage VddH is lower than the source voltage VddH+Vdd, the third field effect transistor M3 is turned on; and because the fourth field effect transistor M4 is an N-type field effect transistor, and the gate voltage Vdd is not higher than the source voltage Vdd, the fourth field effect transistor M4 is turned off That is, when a digital signal "0" is input at the digital signal input end Vin, an output voltage of the second analog signal output end Vout2 is VddH+Vdd.

Because the fifth field effect transistor M5 is a P-type field effect transistor, and the gate voltage VddH is lower than the source voltage VddH+Vdd, the fifth field effect transistor M5 is turned on; and because the sixth field effect transistor M6 is a P-type field effect transistor, and the gate voltage VddH+Vdd is not lower than the source voltage VddH, the sixth field effect transistor M6 is turned off That is, when a digital signal "0" is input at the digital signal input end Vin, an output voltage of the first analog signal output end Vout1 is also VddH+Vdd.

Figure 6:
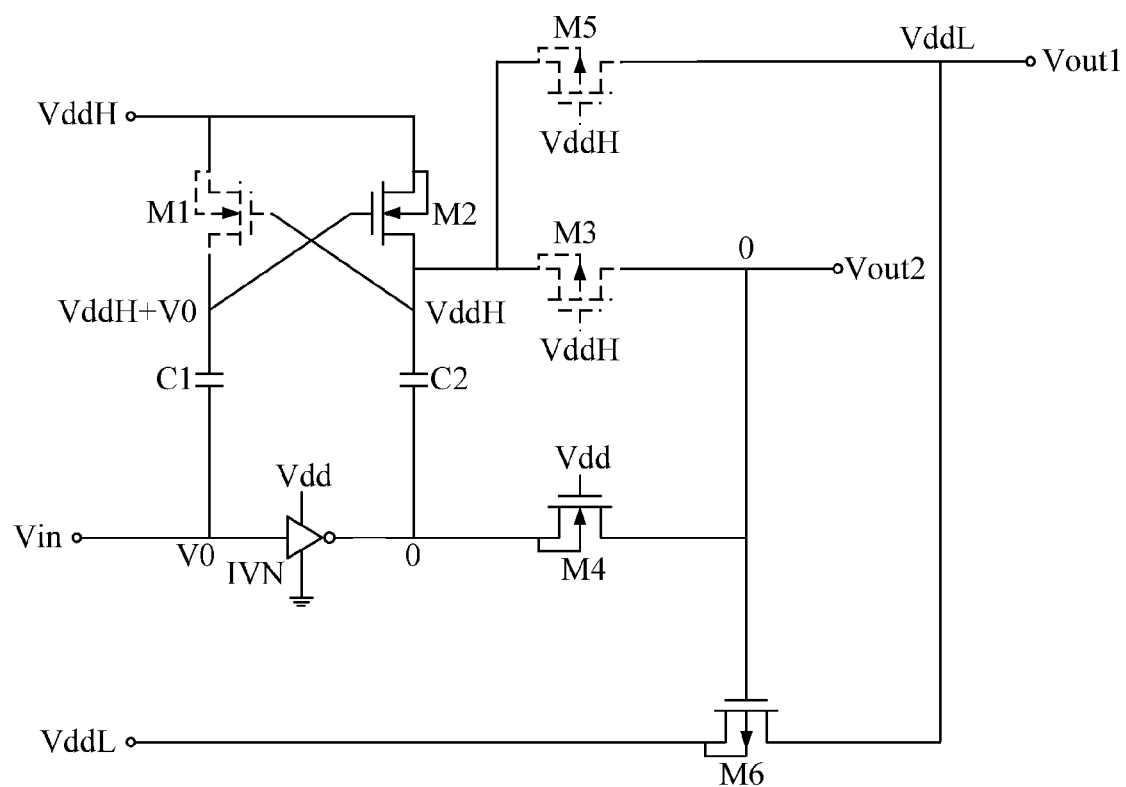
FIG. 6 is a schematic diagram showing potentials at points when a digital signal "1" is input in a level shifter according to Embodiment 1 of the present invention.

When a digital signal "1" is input at the digital signal input end Vin, it is assumed that a voltage corresponding to the digital signal "1" is V0, and V0>0. Potentials at the points in the level shifter shown in FIG. 4 are shown in FIG. 6. A voltage of the input end of the phase inverter IVN is V0, and a voltage of the output end of the phase inverter IVN is 0. Because the voltage difference between the two terminals of the first capacitor C1 and the voltage difference between the two terminals of the second capacitor C2 cannot change suddenly, a voltage at the drain of the first field effect transistor M1, that is, the gate of the second field effect transistor M2, is VddH+V0, and a voltage at the drain of the second field effect transistor M2, at the source of the third field effect transistor M3, and at the source of the fifth field effect transistor M5, that is, the gate of the first field effect transistor M1, is VddH. According to the potentials at the points and types of the field effect transistors, states of the field effect transistors may be determined.

Because the first field effect transistor is an N-type field effect transistor, and the gate voltage VddH is not higher than the source voltage VddH, the first field effect transistor M1 is turned off; and because the second field effect transistor is an N-type field effect transistor, and the gate voltage VddH+V0 is higher than the source voltage VddH, the second field effect transistor M2 is turned on, and the second capacitor C2 is charged.

Because the third field effect transistor M3 is a P-type field effect transistor, and the gate voltage VddH is not lower than the source voltage VddH, the third field effect transistor M3 is turned off; and because the fourth field effect transistor M4 is an N-type field effect transistor, and the gate voltage Vdd is higher than a source voltage 0, the fourth field effect transistor M4 is turned on. That is, when a digital signal "1" is input at the digital signal input end Vin, an output voltage of the second analog signal output end Vout2 is 0.

Because the fifth field effect transistor M5 is a P-type field effect transistor, and the gate voltage VddH is not lower than the source voltage VddH, the fifth field effect transistor M5 is turned off; and because the sixth field effect transistor M6 is a P-type field effect transistor, and a gate voltage 0 is lower than the source voltage VddL, the sixth field effect transistor M6 is turned on. That is, when a digital signal "1" is input at the digital signal input end Vin, an output voltage of the first analog signal output end Vout1 is VddL.

It can be seen that, by using the level shifter provided in Embodiment 1 of the present invention, an output voltage range of the first analog signal output end Vout1 is [VddL, VddH+Vdd], and then, the first direct current power supply and the third direct current power supply that are connected via the circuit may be set according to a target output range, and therefore, it can be implemented that a minimum value of an output voltage is greater than 0.

In addition, the level shifter provided in Embodiment 1 of the present invention further has the second analog signal output end Vout2 whose output voltage range is [0, VddH+Vdd], which can meet requirements of multiple application scenarios.

In the level shifter provided in Embodiment 1 of the present invention, the voltage VddH of the first direct current power supply may be greater than the voltage Vdd of the second direct current power supply. However, when the voltage VddH of the first direct current power supply is greater than the voltage Vdd of the second direct current power supply, a case in which a field effect transistor may bear a voltage greater than the voltage Vdd of the second direct current power supply in the circuit occurs. For example, for the fourth field effect transistor M4 in FIG. 5 and the third field effect transistor M3 in FIG. 6, the field effect transistors bear a voltage greater than the voltage Vdd of the second direct current power supply, which increases the loss of the field effect transistors and reduces the circuit reliability. Therefore, preferably, in the level shifter shown in FIG. 4, the voltage VddH of the first direct current power supply is not greater than the voltage Vdd of the second direct current power supply.

To ensure the circuit reliability when the voltage VddH of the first direct current power supply is greater than the voltage Vdd of the second direct current power supply, the present invention further provides a level shifter, and the details are described below in Embodiment 2.

Embodiment 2

Figure 7:
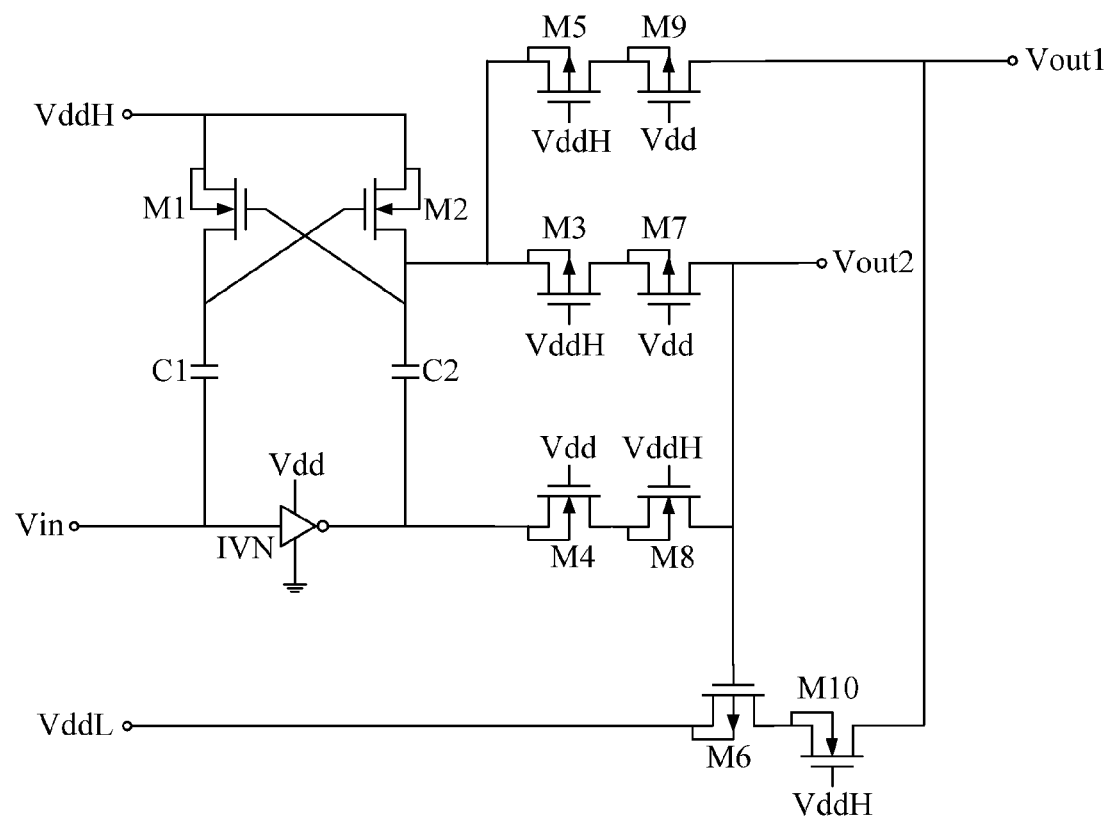
FIG. 7 is a schematic diagram of a level shifter according to Embodiment 2 of the present invention.

Embodiment 2 of the present invention provides a level shifter, which, as shown in FIG. 7, includes a first field effect transistor M1, a second field effect transistor M2, a third field effect transistor M3, a fourth field effect transistor M4, a fifth field effect transistor M5, a sixth field effect transistor M6, a seventh field effect transistor M7, an eighth field effect transistor M8, a ninth field effect transistor M9, a tenth field effect transistor M10, a first capacitor C1, a second capacitor C2, and a phase inverter IVN, where the first field effect transistor M1, the second field effect transistor M2, the fourth field effect transistor M4, the eighth field effect transistor, and the tenth field effect transistor are N-type field effect transistors; and the third field effect transistor M3, the fifth field effect transistor M5, the sixth field effect transistor M6, the seventh field effect transistor, and the ninth field effect transistor are P-type field effect transistors; a source of the first field effect transistor M1 is connected to a source of the second field effect transistor M2, and a connecting end after the connection is connected to a first direct current power supply; a drain of the first field effect transistor M1 and a gate of the second field effect transistor M2 are connected to one terminal of the first capacitor C1; and the other terminal of the first capacitor C1 is connected to an input end of the phase inverter IVN, and a connecting end after the connection is used as a digital signal input end Vin; a gate of the first field effect transistor M1, a drain of the second field effect transistor M2, a source of the third field effect transistor M3, and a source of the fifth field effect transistor M5 are connected to one terminal of the second capacitor C2; and the other terminal of the second capacitor C2 and a source of the fourth field effect transistor M4 are connected to an output end of the phase inverter IVN; a power supply end of the phase inverter IVN is connected to a second direct current power supply, where the second direct current power supply is a working power supply of the level shifter, and a sum of a voltage VddH of the first direct current power supply and a voltage Vdd of the second direct current power supply is a maximum value of a target output voltage of the level shifter; a source of the sixth field effect transistor M6 is connected to a third direct current power supply, where a voltage VddL of the third direct current power supply is a minimum value of the target output voltage of the level shifter; a drain of the third field effect transistor M3 is connected to a source of the seventh field effect transistor M7; the drain of the fourth field effect transistor M4 is connected to a source of the eighth field effect transistor M8; and a drain of the seventh field effect transistor M7 and a drain of the eighth field effect transistor M8 are connected to a gate of the sixth field effect transistor M6; the drain of the fifth field effect transistor M5 is connected to a source of the ninth field effect transistor M9; the drain of the sixth field effect transistor M6 is connected to a source of the tenth field effect transistor M10; and a drain of the ninth field effect transistor M9 is connected to a drain of the tenth field effect transistor M10, and a connecting end after the connection is used as a first analog signal output end Vout1; and when a digital signal "0" is input at the digital signal input end, the third field effect transistor M3, the fifth field effect transistor M5, the seventh field effect transistor M7, and the ninth field effect transistor M9 are turned on, and the fourth field effect transistor M4, the eighth field effect transistor M8, and the tenth field effect transistor M10 are turned off; and when a digital signal "1" is input at the digital signal input end, the third field effect transistor M3, the fifth field effect transistor M5, the seventh field effect transistor M7, and the ninth field effect transistor M9 are turned off, and the fourth field effect transistor M4, the eighth field effect transistor M8, and the tenth field effect transistor M10 are turned on.

Further, a connecting end formed after the drain of the seventh field effect transistor M7 and the drain of the eighth field effect transistor M8 are connected to the gate of the sixth field effect transistor M6 may be used as a second analog signal output end Vout2.

In Embodiment 2 of the present invention, a gate of the third field effect transistor M3, a gate of the fifth field effect transistor M5, a gate of the eighth field effect transistor M8, and a gate of the tenth field effect transistor M10 may be connected to the first direct current power supply, and a gate of the fourth field effect transistor M4, a gate of the seventh field effect transistor M7, and a gate of the ninth field effect transistor M9 may be connected to the second direct current power supply. In this way, when a digital signal "0" is input at the digital signal input end, it can be implemented that the third field effect transistor M3, the fifth field effect transistor M5, the seventh field effect transistor M7, and the ninth field effect transistor M9 are turned on, and the fourth field effect transistor M4, the eighth field effect transistor M8, and the tenth field effect transistor M10 are turned off; and when a digital signal "1" is input at the digital signal input end, the third field effect transistor M3, the fifth field effect transistor M5, the seventh field effect transistor M7, and the ninth field effect transistor M9 are turned off, and the fourth field effect transistor M4, the eighth field effect transistor M8, and the tenth field effect transistor M10 are turned on.

Connecting manners of the gates of the third field effect transistor M3, the fourth field effect transistor M4, the fifth field effect transistor M5, the seventh field effect transistor M7, the eighth field effect transistor M8, the ninth field effect transistor M9, and the tenth field effect transistor M10 are merely used as examples, but are not intended to limit the present invention.

Figure 8:
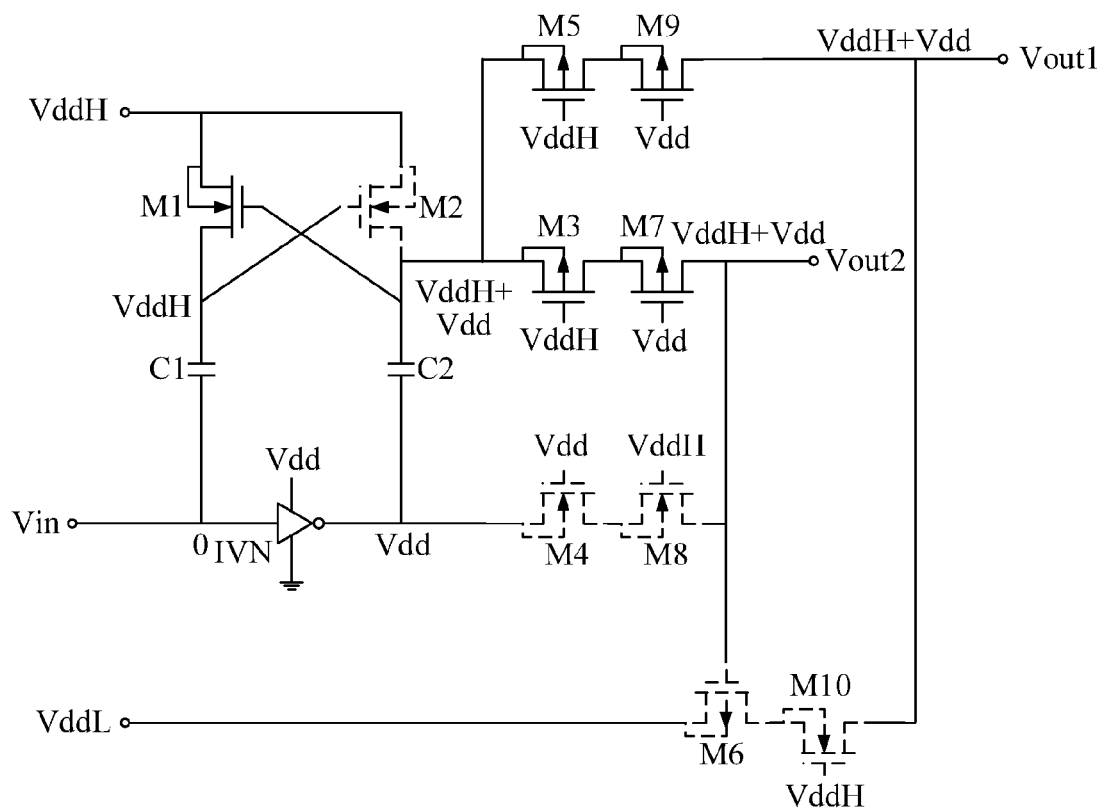
FIG. 8 is a schematic diagram showing potentials at points when a digital signal "0" is input in a level shifter according to Embodiment 2 of the present invention.

When a digital signal "0" is input at the digital signal input end Vin, a voltage corresponding to the digital signal "0" is 0. Potentials at points in the level shifter shown in FIG. 7 are shown in FIG. 8, an output voltage of the first analog signal output end Vout1 is VddH+Vdd, and an output voltage of the second analog signal output end Vout2 is VddH+Vdd.

Figure 9:
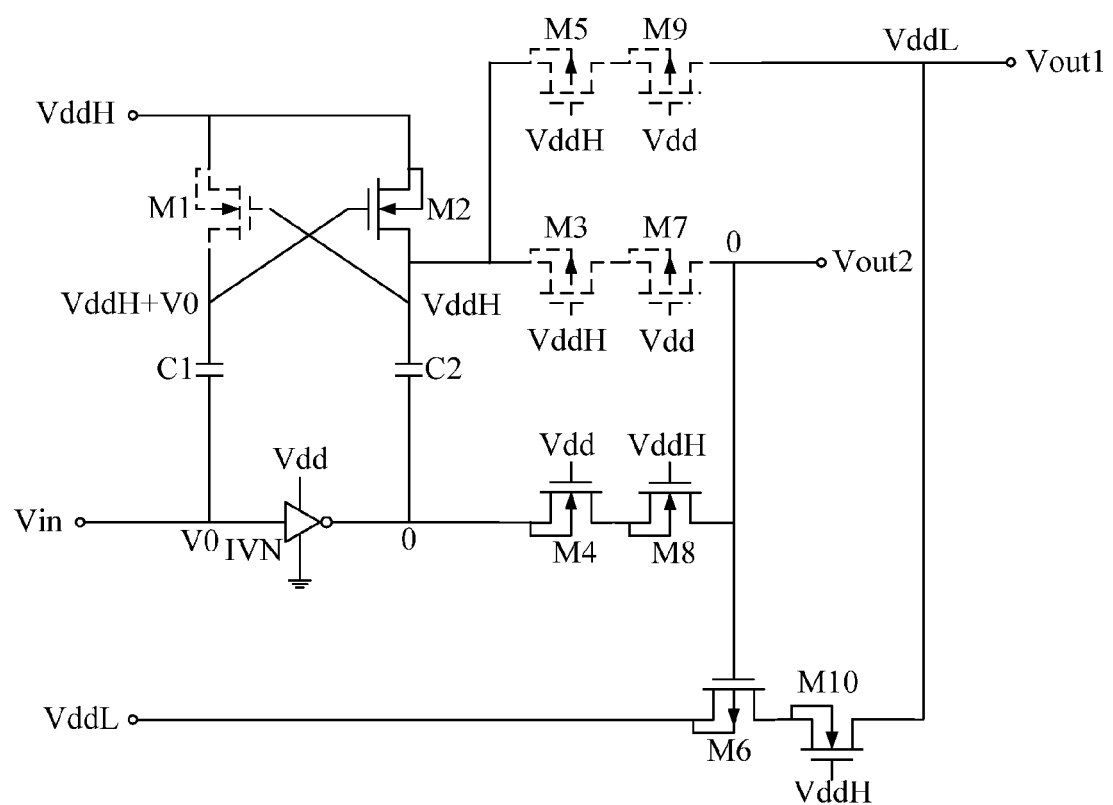
FIG. 9 is a schematic diagram showing potentials at points when a digital signal "1" is input in a level shifter according to Embodiment 2 of the present invention.

When a digital signal "1" is input at the digital signal input end Vin, it is assumed that a voltage corresponding to the digital signal "1" is V0, and V0>0. Potentials at the points in the level shifter shown in FIG. 7 are shown in FIG. 9, an output voltage of the first analog signal output end Vout1 is VddL, and an output voltage of the second analog signal output end Vout2 is 0.

A working principle of the level shifter provided in Embodiment 2 of the present invention is the same as that of the level shifter provided in the foregoing Embodiment 1, and the details are not described again herein.

In addition, compared with the level shifter provided in the foregoing Embodiment 1, the level shifter provided in Embodiment 2 of the present invention is added with cascaded field effect transistors, and voltage division can be performed; and when a voltage VddH of a first direct current power supply is greater than a voltage Vdd of a second direct current power supply, a case in which the field effect transistors bear a voltage greater than the voltage Vdd of the second direct current power supply in the circuit can be avoided, which can reduce the loss of the field effect transistors and improve the circuit reliability.

Embodiment 3

Embodiment 3 of the present invention further provides a digital to analog converter, including the level shifter according to either of the foregoing embodiments.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. A level shifter, comprising:
a first field effect transistor;
a second field effect transistor;
a third field effect transistor;
a fourth field effect transistor;
a fifth field effect transistor;
a sixth field effect transistor;
a first capacitor;
a second capacitor; and
a phase inverter,
wherein the first field effect transistor, the second field effect transistor, and the fourth field effect transistor are N-type field effect transistors, and the third field effect transistor, the fifth field effect transistor, and the sixth field effect transistor are P-type field effect transistors,
wherein a source of the first field effect transistor is connected to a source of the second field effect transistor, and a connecting end after the connection is connected to a first direct current power supply,
wherein a drain of the first field effect transistor and a gate of the second field effect transistor are connected to one terminal of the first capacitor, and the other terminal of the first capacitor is connected to an input end of the phase inverter, and a connecting end after the connection is used as a digital signal input end,
wherein a gate of the first field effect transistor, a drain of the second field effect transistor, a source of the third field effect transistor, and a source of the fifth field effect transistor are connected to one terminal of the second capacitor, and the other terminal of the second capacitor and a source of the fourth field effect transistor are connected to an output end of the phase inverter,
wherein a power supply end of the phase inverter is connected to a second direct current power supply,
wherein the second direct current power supply is a working power supply of the level shifter, and a sum of a voltage of the first direct current power supply and a voltage of the second direct current power supply is a maximum value of a target output voltage of the level shifter,
wherein a source of the sixth field effect transistor is connected to a third direct current power supply,
wherein a voltage of the third direct current power supply is a minimum value of the target output voltage of the level shifter,
wherein a drain of the third field effect transistor and a drain of the fourth field effect transistor are connected to a gate of the sixth field effect transistor, and a drain of the fifth field effect transistor is connected to a drain of the sixth field effect transistor, and a connecting end after the connection is used as a first analog signal output end, and wherein when a digital signal "0" is input at the digital signal input end, the third field effect transistor and the fifth field effect transistor are turned on, and the fourth field effect transistor is turned off, and when a digital signal "1" is input at the digital signal input end, the third field effect transistor and the fifth field effect transistor are turned off, and the fourth field effect transistor is turned on.

2. The level shifter according to claim 1, wherein a connecting end formed after the drain of the third field effect transistor and the drain of the fourth field effect transistor are connected to the gate of the sixth field effect transistor is used as a second analog signal output end.

3. The level shifter according to claim 1, wherein a gate of the third field effect transistor and a gate of the fifth field effect transistor are connected to the first direct current power supply, and wherein a gate of the fourth field effect transistor is connected to the second direct current power supply.

4. The level shifter according to claim 1, further comprising:
a seventh field effect transistor;
an eighth field effect transistor;
a ninth field effect transistor; and
a tenth field effect transistor,
wherein the seventh field effect transistor and the ninth field effect transistor are P-type field effect transistors, and the eighth field effect transistor and the tenth field effect transistor are N-type field effect transistors,
wherein the drain of the third field effect transistor is connected to a source of the seventh field effect transistors the drain of the fourth field effect transistor is connected to a source of the eighth field effect transistor, and a drain of the seventh field effect transistor and a drain of the eighth field effect transistor are connected to the gate of the sixth field effect transistor,
wherein the drain of the fifth field effect transistor is connected to a source of the ninth field effect transistor the drain of the sixth field effect transistor is connected to a source of the tenth field effect transistor, and a drain of the ninth field effect transistor is connected to a drain of the tenth field effect transistor, and a connecting end after the connection is used as the first analog signal output end, and
wherein when a digital signal "0" is input at the digital signal input end, the seventh field effect transistor and the ninth field effect transistor are turned on, and the eighth field effect transistor and the tenth field effect transistor are turned off and when a digital signal "1" is input at the digital signal input end, the seventh field effect transistor and the ninth field effect transistor are turned off, and the eighth field effect transistor and the tenth field effect transistor are turned on.

5. The level shifter according to claim 4, wherein a connecting end formed after the drain of the seventh field effect transistor and the drain of the eighth field effect transistor are connected to the gate of the sixth field effect transistor is used as the second analog signal output end.

6. The level shifter according to claim 4, wherein a gate of the seventh field effect transistor and a gate of the ninth field effect transistor are connected to the second direct current power supply, and wherein a gate of the eighth field effect transistor and a gate of the tenth field effect transistor are connected to the first direct current power supply.

7. The level shifter according to claim 1, wherein the level shifter is comprised in a digital to analog converter.

* * * * *

UNITED STATES PATENT AND TRADEMARK OFFICE
CERTIFICATE OF CORRECTION

PATENT NO. : 9,172,375 B1  Page 1 of 1
APPLICATION NO. : 14/672919
DATED : October 27, 2015
INVENTOR(S) : Liren Zhou et al.

It is certified that error appears in the above-identified patent and that said Letters Patent is hereby corrected as shown below:

ON THE TITLE PAGE

Foreign Application Priority Data Section should read:

Apr. 16, 2014 (CN) ............................... 201410152918.8

IN THE CLAIMS

Column 12, Lines 31-38, Claim 4 should read:

The level shifter according to claim 1, further comprising:
  a seventh field effect transistor;
  an eighth field effect transistor;
  a ninth field effect transistor; and
  a tenth field effect transistor,
  wherein the seventh field effect transistor and the ninth field effect transistor are P-type field effect transistors, and the eighth field effect transistor and the tenth field effect transistor are N-type field effect transistors,
  wherein the drain of the third field effect transistor is connected to a source of the seventh field effect transistor, the drain of the fourth field effect transistor is connected to a source of the eighth field effect transistor, and a drain of the seventh field effect transistor and a drain of the eighth field effect transistor are connected to the gate of the sixth field effect transistor,
  wherein the drain of the fifth field effect transistor is connected to a source of the ninth field effect transistor, the drain of the sixth field effect transistor is connected to a source of the tenth field effect transistor, and a drain of the ninth field effect transistor is connected to a drain of the tenth field effect transistor, and a connecting end after the connection is used as the first analog signal output end, and
   wherein when a digital signal "0" is input at the digital signal input end, the seventh field effect transistor and the ninth field effect transistor are turned on, and the eighth field effect transistor and the tenth field effect transistor are turned off, and when a digital signal "1" is input at the digital signal input end, the seventh field effect transistor and the ninth field effect transistor are turned off, and the eighth field effect transistor and the tenth field effect transistor are turned on.

Signed and Sealed this
Sixteenth Day of February, 2016

Michelle K. Lee
*Director of the United States Patent and Trademark Office*

UNITED STATES PATENT AND TRADEMARK OFFICE
CERTIFICATE OF CORRECTION

Page 1 of 2

PATENT NO. : 9,172,375 B1
APPLICATION NO. : 14/672919
DATED : October 27, 2015
INVENTOR(S) : Liren Zhou et al.

It is certified that error appears in the above-identified patent and that said Letters Patent is hereby corrected as shown below:

ON THE TITLE PAGE

Item 30 Foreign Application Priority Data Section should read:

Apr. 16, 2014 (CN)................................. 201410152918.8

IN THE CLAIMS

Column 12, Lines 31-38, Claim 4 should read:

The level shifter according to claim 1, further comprising:
    a seventh field effect transistor;
    an eighth field effect transistor;
    a ninth field effect transistor; and
    a tenth field effect transistor,
    wherein the seventh field effect transistor and the ninth field effect transistor are P-type field effect transistors, and the eighth field effect transistor and the tenth field effect transistor are N-type field effect transistors,
    wherein the drain of the third field effect transistor is connected to a source of the seventh field effect transistor, the drain of the fourth field effect transistor is connected to a source of the eighth field effect transistor, and a drain of the seventh field effect transistor and a drain of the eighth field effect transistor are connected to the gate of the sixth field effect transistor,
    wherein the drain of the fifth field effect transistor is connected to a source of the ninth field effect transistor, the drain of the sixth field effect transistor is connected to a source of the tenth field effect transistor, and a drain of the ninth field effect transistor is connected to a drain of the tenth field effect transistor, and a connecting end after the connection is used as the first analog signal output end, and This certificate supersedes the Certificate of Correction issued February 16, 2016.

Signed and Sealed this
Twenty-first Day of June, 2016

Michelle K. Lee
*Director of the United States Patent and Trademark Office* wherein when a digital signal "0" is input at the digital signal input end, the seventh field effect transistor and the ninth field effect transistor are turned on, and the eighth field effect transistor and the tenth field effect transistor are turned off, and when a digital signal "1" is input at the digital signal input end, the seventh field effect transistor and the ninth field effect transistor are turned off, and the eighth field effect transistor and the tenth field effect transistor are turned on.